(12) United States Patent
Neefs et al.

(10) Patent No.: US 7,607,071 B2
(45) Date of Patent: Oct. 20, 2009

(54) ERROR CORRECTION USING ITERATING GENERATION OF DATA SYNDROME

(75) Inventors: Henk Gomarus Caroline Neefs, Palo Alto, CA (US); Allen J. Baum, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 604 days.

(21) Appl. No.: 11/046,491

(22) Filed: Jan. 28, 2005

(65) Prior Publication Data

US 2006/0174182 A1     Aug. 3, 2006

(51) Int. Cl.
*H03M 13/00*     (2006.01)
(52) U.S. Cl. .................................... 714/785; 714/786
(58) Field of Classification Search ................. 714/785, 714/781, 758, 752, 786
See application file for complete search history.

(56) References Cited

U.S. PATENT DOCUMENTS

| | | | | |
|---|---|---|---|---|
| 4,359,772 A | * | 11/1982 | Patel ........................ | 714/761 |
| 4,564,944 A | * | 1/1986 | Arnold et al. ............... | 714/759 |
| 5,291,498 A | * | 3/1994 | Jackson et al. .............. | 714/758 |
| 5,487,077 A | * | 1/1996 | Hassner et al. .............. | 714/762 |
| 5,537,421 A | * | 7/1996 | Dujari et al. ................. | 714/785 |
| 5,623,506 A | * | 4/1997 | Dell et al. .................... | 714/766 |
| 5,712,861 A | * | 1/1998 | Inoue et al. .................. | 714/752 |
| 5,812,564 A | * | 9/1998 | Bonke et al. ................. | 714/769 |
| 5,844,919 A | * | 12/1998 | Glover et al. ................ | 714/769 |
| 5,974,583 A | * | 10/1999 | Joo ............................. | 714/784 |
| 6,003,144 A | * | 12/1999 | Olarig et al. ................. | 714/42 |
| 6,272,659 B1 | * | 8/2001 | Zook ........................... | 714/774 |
| 6,651,214 B1 | * | 11/2003 | Weng et al. .................. | 714/771 |
| 6,675,349 B1 | * | 1/2004 | Chen ........................... | 714/804 |
| 7,266,760 B1 | * | 9/2007 | Bain ............................ | 714/807 |
| 2002/0023246 A1 | * | 2/2002 | Jin .............................. | 714/755 |
| 2004/0107397 A1 | * | 6/2004 | Holman ....................... | 714/752 |

* cited by examiner

*Primary Examiner*—Esaw T Abraham
(74) *Attorney, Agent, or Firm*—Blakely, Sokoloff, Taylor & Zafman LLP (57) ABSTRACT

An embodiment of the present invention is a technique to perform error correction using a trial-and-error method. A syndrome generator provides a generation of a data syndrome of a data word modified according to a selection of at least one of error correcting parameters. The data word is associated with at least one transaction performed on a unit. A controller controls iterating the generation of the data syndrome.

54 Claims, 7 Drawing Sheets

FIG. 7

ERROR CORRECTION USING ITERATING GENERATION OF DATA SYNDROME

BACKGROUND OF THE INVENTION

1. Field of the Invention

Embodiments of the invention relate to the field of microprocessors, and more specifically, to error correction.

2. Description of Related Art

As microprocessor architecture becomes more and more complex to support high performance applications, efficient error detection and correction of data become a challenge. High performance microprocessor, storage, or communication systems usually are susceptible to a number of different types of errors including device failures, wire failures, hard and soft errors on memory cells, etc.

Existing techniques to address the problems of error detection and correction of memory or communication data have a number of disadvantages. Typically, these techniques use specialized hardware circuits or components designed according to a code polynomial. These techniques are costly, requiring complicated hardware structures. They are also not flexible and may not accommodate a variety of different types of errors.

BRIEF DESCRIPTION OF THE DRAWINGS

Embodiments of invention may best be understood by referring to the following description and accompanying drawings that are used to illustrate embodiments of the invention. In the drawings.

DETAILED DESCRIPTION OF THE INVENTION

An embodiment of the present invention is a technique to perform error correction using a trial-and-error method. A syndrome generator provides a generation of a data syndrome on a data word modified according to a selection of at least one of error correcting parameters. The data word is associated with at least one transaction performed on a unit. A controller controls iterating the generation of the data syndrome.

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc.

One embodiment of the invention is a technique to correct data errors using a trial-and-error method. The trial-and-error method is performed by iterating on various selections of error correcting parameters. Examples of the correcting parameters are error types bit position(s), and parity correction position(s). The technique performs complex corrections in the time domain rather than in the spatial domain where complex circuit structures are used. The technique also provides flexible trade-off between correctability and mis-correction tolerances.

Figure 1:
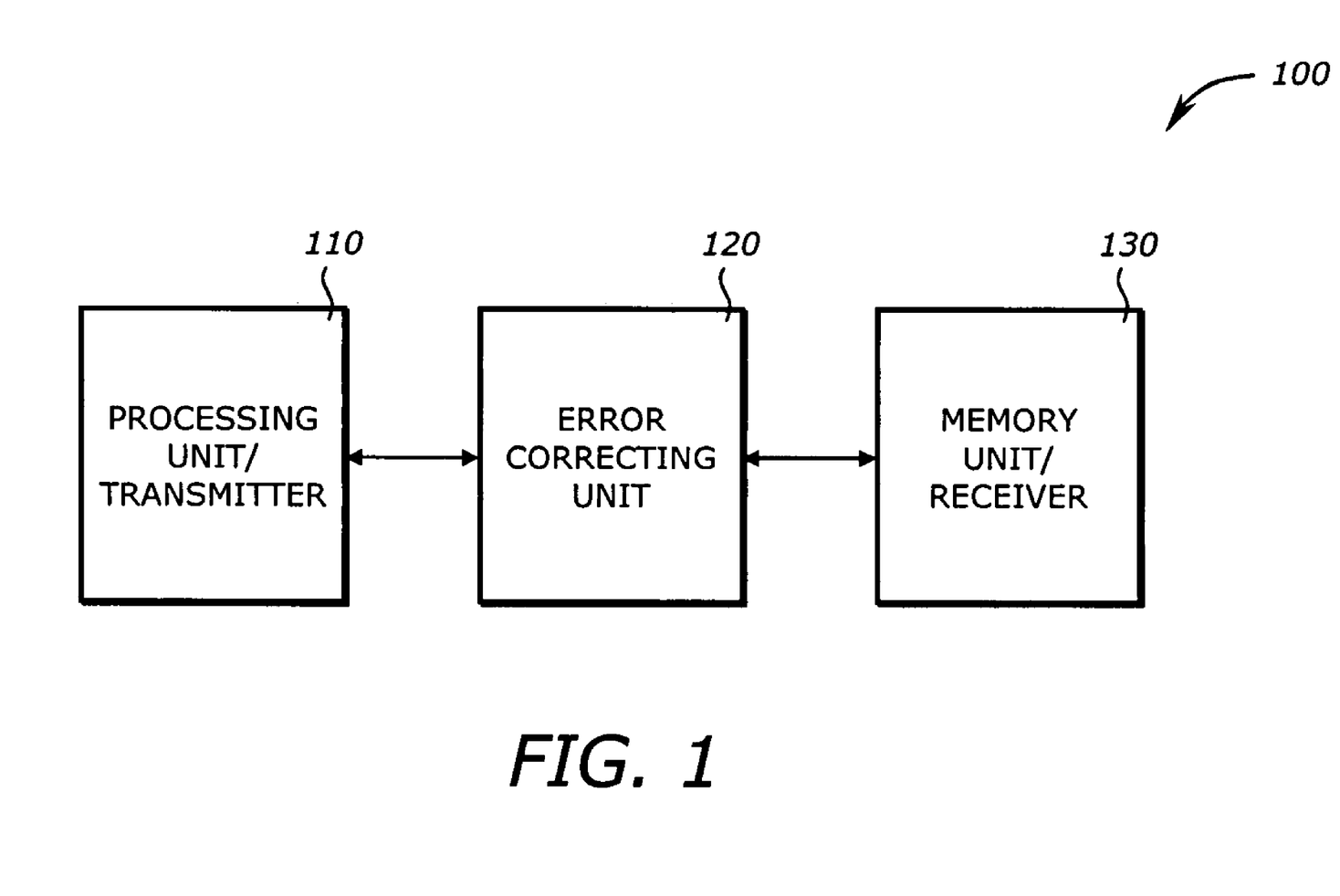
FIG. 1 is a diagram illustrating a system in which one embodiment of the invention can be practiced.

FIG. 1 is a diagram illustrating a system 100 in which one embodiment of the invention can be practiced. The system 100 includes a processing unit/transmitter 110, an error correcting unit 120, and a memory unit/receiver 130. The system 100 may represent any system in which correction of errors is desired. Examples of the system 100 may include a microprocessor, a multi-core microprocessor, a microprocessor system, a communication system, a data processing system, a storage system (e.g., hard disk controller), etc.

The processing unit/transmitter 110 may be any device that generates a transaction or event involving a series of data words. It may be a processor, a multi-core processor a microprocessor, a micro-controller, a data generator, a transmitter, etc. The transaction may be a read transaction, a write transaction, a data movement transaction, a data transfer transaction, a snoop transaction, etc.

The error correcting unit (ECU) 120 is a unit that corrects the data between the processing unit/transmitter 110 and the memory unit/receiver 130. It may receive the data from the processing unit/transmitter 120 or the memory unit/receiver 130, perform an error detection and correction on the data, and forward the corrected data to the intended destination. It may perform this operation over a single transaction or multiple transactions. The data may come in single word or burst of multiple words. The data word length may be any length fitted to the data paths. The ECU 120 performs error detection and correction using an iterative trial-and-error technique. This technique is efficient, flexible, and saves significant hardware. The ECU 120 may be reconfigured by either the processing unit/transmitter 110 or the memory unit/receiver 130 to operate in different modes depending on the system requirements, trade-off between speed and correctability, a priori knowledge of error types, communication channel characteristics, etc.

The ECU 120 may perform the following operations to correct errors: (1) iterations; (2) iterations over multiple sets of parameters such as error types, bit positions, etc; (3) using redundant check bits to guide what bit position or positions to correct, or to guide what types of errors to correct, or to determine if the correction was successful; (4) using separate types of check bits simultaneously to derive position and type separately from whether the correction was successful; and (5) using information from previously seen errors to guide what bit position or positions to correct, or to guide what types of errors to correct. The check codes may be any type of error correcting codes. Examples of these codes are parity and cyclic redundancy codes (CRC).

The memory unit/receiver 130 may include any device or a plurality of devices that store or receive the data from the processing unit/transmitter 110. It may include one or more memory devices, such as static random access memories (SRAM) or dynamic random access memories (DRAM). It may also be a receiver in a communication system. It may be a cache memory that stores data cache, instructions, or both. It may be located internally or externally to a processor, or in a chipset.

Figure 2:
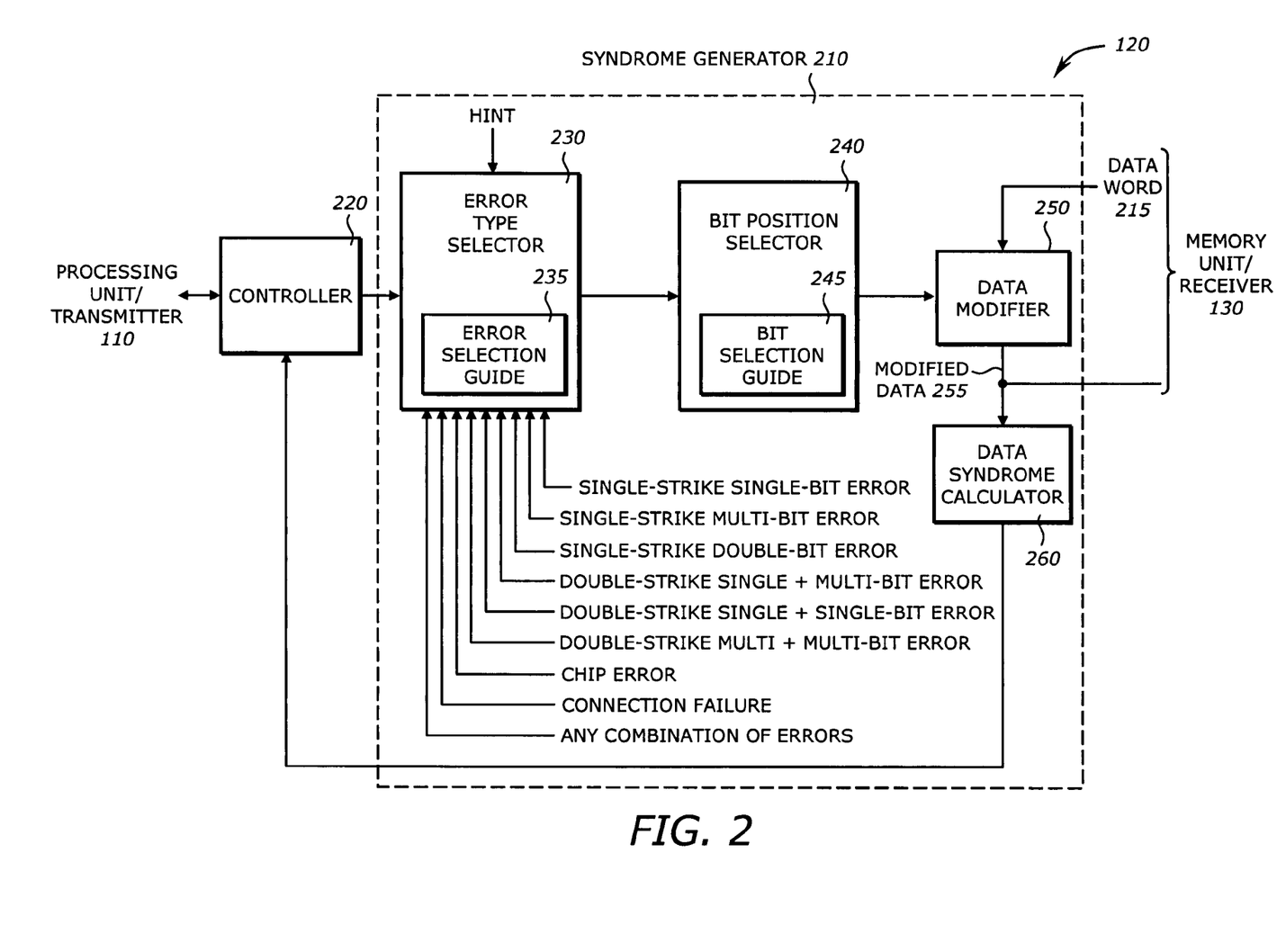
FIG. 2 is a diagram illustrating an error correcting unit using trial and error according to one embodiment of the invention.

FIG. 2 is a diagram illustrating the error correcting unit 120 using trial-and-error technique according to one embodiment of the invention. The ECU 120 includes a syndrome generator 210 and a controller 220.

The syndrome generator 210 provides a generation of a data syndrome from a data word modified according to an error correcting parameter selection. The data word is associated with a transaction performed on a unit such as the memory unit/receiver 130 (FIG. 1). The data syndrome is used to determine if the modified data word is the corrected data word. Typically, when the data syndrome is equal to zero, the modified data word is free of error and corresponds to the corrected data word. The syndrome generator 210 generates the data syndromes iteratively in a trial-and-error approach.

The error correcting parameter may be any parameter that has impact or influence on the correctability of the errors. In one embodiment, the error correcting parameters may be at least one of an error type, a bit position, and a parity correction position. The syndrome generator 210 includes an error type selector 230, a bit position selector 240, a data modifier 250, and a data syndrome calculator 260.

The error type selector 230 selects an error type for the data word. The error type may be any one of a single-strike single-bit error type, a single-strike multi-bit error type, a double-strike single+single-bit error type, a double-strike single+multi-bit error type, a double-strike multi+multi-bit error type, a chip or device error type, and a connection failure type or any combination of them. Examples of combinations include chip error and single-strike single-bit error, connection failure and single-strike single-bit, etc. As is known by one skilled in the art, any other error type, or any combination of these errors may be included. It is noted that the more error types are included, the higher the likelihood for a miscorrection becomes. The strike refers to an event or a transaction that can flip one or several bits within a very limited spatial region (e.g., a region of one to five bits). A double-strike single+single-bit error refers to an error type where there are two strikes, or two separate events, each flipping a single-bit. The chip error type refers to the error that affects an entire chip or device which stores part of the data word. The connection failure is a failure or error on the wire connection such as an open or short-circuit. The error type selector 230 includes an error selection guide 235 to guide selection of the error type. The guidance may use a hint based on one of a syndrome of a group of check bits and an observation of transactions to the unit. The objective of the error selection guide is to narrow down the search to speed up the correction process and to prevent miscorrections. Knowledge about the application environment, the types of errors typically encountered, the frequency of a particular error type, and other relevant information may provide some intelligence in selecting or making assumptions about the error type. History of past corrections may also be another factor to determine the error type. For example, if the previous corrections seem to center around two adjacent bit positions, then the error selection guide may infer that a failure at the two wires carrying signals at these two bit positions may be highly likely.

The bit position selector 240 selects at least one bit position of the data word to be modified based on the selected error type. This one bit position may correspond to a single bit or a start bit position of a group of bits. The number of bit positions may be one, two, or three, or any number depending on the selected error type. For example, if the error type is assumed to be a single-strike double-bit errors, then the bit selector 240 selects two bit positions in the data word that errors are most likely to occur. The bit selector 240 includes a bit selection guide 245 to guide selection of the at least one bit position. The guidance may be based on the selected error type.

The data modifier 250 modifies a data word 215 using the selected at least one bit position. The data word 245 may come from a memory unit including a number of memory devices. For binary data, modifying a bit in a data word for correction purposes means complementing or flipping the bit, i.e., changing a zero to a one, or a one to a zero. The data modifier 250 may include a simple bit flipper or a more complex structure depending on the data organization and the error correction scheme being used. The data modifier provides a modified data 255 to the data syndrome calculator 260.

The data syndrome calculator 260 calculates the data syndrome of the modified data word. If the data syndrome is equal to zero, it is highly likely that the modified data word is corrected. Otherwise, the modified data word is not corrected and further processing or more iterations are necessary. The data syndrome is used by the controller 220.

The controller 220 controls iterating the generation of the data syndrome. It provides control signals to the syndrome generator 210 using several criteria or guidance. The controller 220 receives the data syndrome from the data syndrome calculator 260 to determine if further processing or more iterations are necessary. It may contain a state machine to control the iterations and/or generate control signals to the syndrome generator 210.

Figure 3:
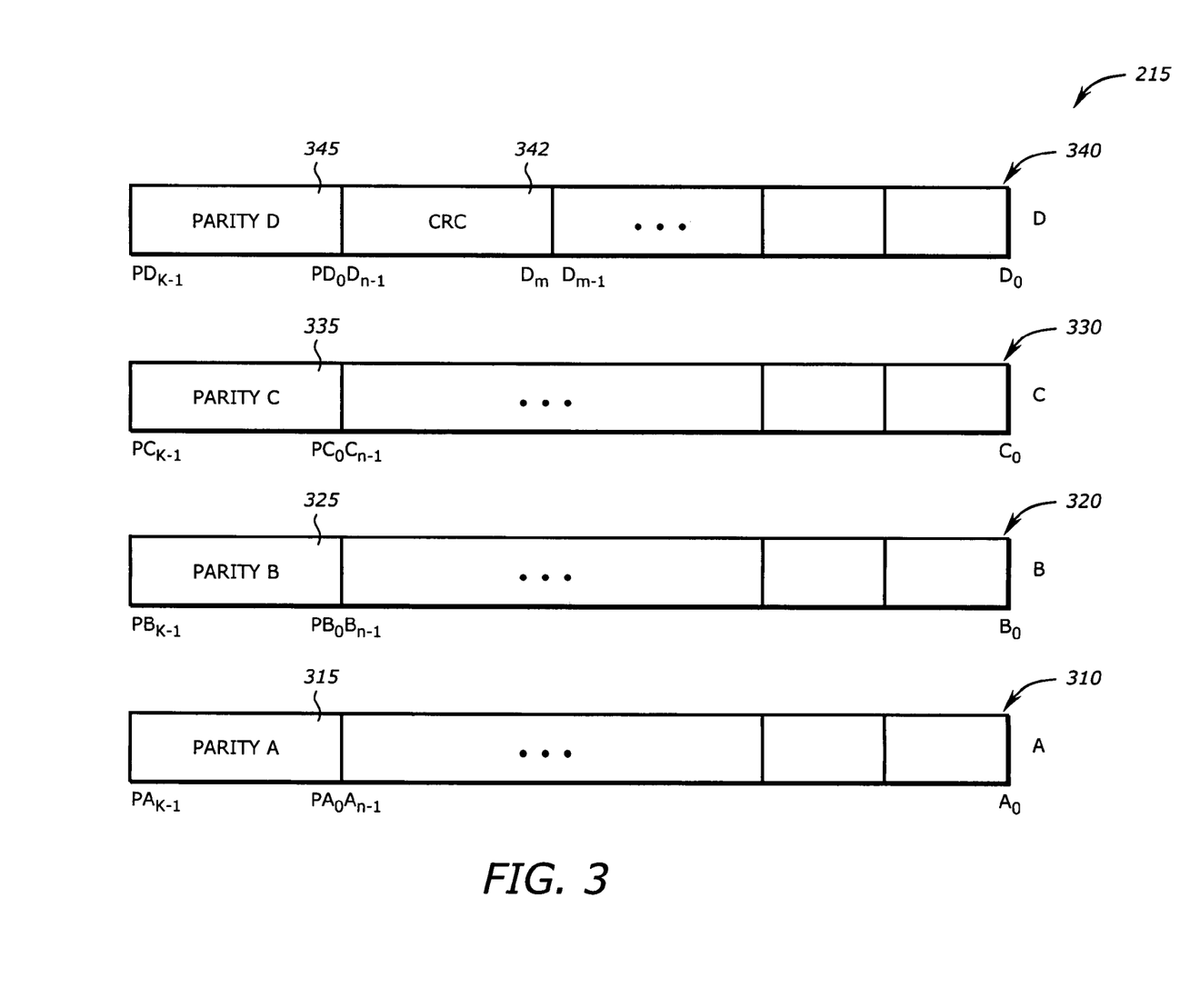
FIG. 3 is a diagram illustrating a data word format according to one embodiment of the invention.

FIG. 3 is a diagram illustrating a data word 215 according to one embodiment of the invention. The data word 125 shows a series of ticks. A tick is a portion of data word that is sent serially. For illustrative purposes, only four ticks are shown: ticks A, B, C, and D, corresponding to four words 310, 320, 330, and 340, respectively. The number of ticks may be any number.

Each of the words 310, 320, 330, and 330 includes data bits and the corresponding parity unit or bits. Each of the words 310, 320, 330, and 330 is transferred to or from the device (e.g., a memory unit) in a transaction. Word 310 includes payload bits $A_0$ to $A_{n-1}$ and the parity bits 315 $PA_0$ to $PA_{K-1}$. Word 320 includes payload bits $B_0$ to $B_{n-1}$ and the parity bits 325 $PB_0$ to $PB_{K-1}$. Word 330 includes payload bits $C_0$ to $C_{n-1}$ and the parity bits 335 $PC_0$ to $PC_{K-1}$. Word 340 includes payload bits $D_0$ to $D_{m-1}$ and the parity bits 345 $PD_0$ to $PD_{K-1}$. The word 340 further includes a CRC word 342 from $D_m$ to $D_{n-1}$. The location of the CRC word 342 is arbitrary. It may be located anywhere within the data word 215. In one embodiment, the CRC word 342 is located at one end of the data word. This enhances the checking properties for most frequently occurring errors.

The word length is any length depending on the applications. Typically, it is in the order of eighty to many hundred bits. In one embodiment, K is 8, n is typically 136, m is typically 121, and the length of the CRC word 342 is 15. The total number of 8-bit memory devices is 18. Because of this long word length, a direct hardware implementation as in the prior art techniques is costly. The trial-and-error technique provides a much better solution in terms of flexibility, performance, and efficiency.

It is noted that the CRC word 342 and the parity bits are used to enforce a strong error correcting code (ECC). The CRC word 342 may be replaced by any checking code. It may be another ECC code or a randomly generated parity check code. In this illustrative example, the CRC word 342 is calculated over the data bits, across the ticks. The parity is calculated over the bits within a tick, whether the bits are data word bits only, or CRC bits with data word bits. The parity is calculated such that once a failing unit is known, it contains the necessary information to reconstruct the information of the failing unit. The failing unit may be a device, a wire, or a memory cell.

The parity bits are calculated as follows:

$$PZ_j = Z_{n-(8-j)} \text{XOR } Z_{n-(16-j)} \text{XOR} \ldots Z_{(8+j)} \text{XOR } Z_j \quad (1)$$

where j=0, ..., 7; Z=A, B, C, or D; and XOR is Exclusive-OR operation, and n is the number of data or data+CRC bits in a tick.

It has been found that an important CRC code, which is also an ECC by itself, is 0X5BF3 where 0X denotes hexadecimal notation. The constant 0X5BF3 represents the coefficients of a polynomial over Galois Field GF(2) as is known by one skilled in the art and is referred to as the CRC coefficients over GF(2) of the corresponding CRC code. This CRC code generates 14 check bits. The mirrored version of this check code, 0X67ED, has similar properties and is also a strong ECC. Permutations of these CRC check bits may also result in other check codes which may be almost as strong as these CRC codes. These check codes are strong especially when used in conjunction with the parity bits. Together, they enable 100% correction of device failure, of single-bit errors, of single-strike errors in up to a group of 8-bits (aligned to 8-bit boundary), and single-bit+single-bit errors. These codes may also be used to detect all single+single errors, all double+double-errors, all triple+single errors, and all triple+triple errors, and other combinations of errors.

Much stronger CRC codes may also be generated from the above CRC codes by adding an overall parity bit, such as by multiplying the CRC polynomial with an x+1 polynomial. This results in two CRC codes 0XA837 and its mirrored version 0XEC15 which generate 15 check bits. These stronger CRC codes allow extremely good (e.g., full or almost full) correctability of single-strike errors including 1-bit, 2-bit, 3-bit, and 4-bit, even in the absence of parity. Examples where the parity information is absent include when the parity is used up for mapping out a device after device failure or mapping out a wire after wire failure.

Even stronger codes may also be generated by multiplying these CRC codes with other polynomials. Variations may be created by permuting the check bits of the resulting code or the data bits. Any combination of the variations may also be used. For example, the codes may be formed by the product of these CRC codes with other polynomials, and then a permutation of the check bits or data bits. Every code that is generated through these operations has roots in the originating code. The codes may be made stronger by adding more levels of checking than just using the parity and CRC. In other words, the code may be formed by at least: (1) a product of one of 0X5BF3, 0X67ED, 0XA837 and 0XEC15 and a polynomial, (2) one of one of 0X5BF3, 0X67ED, 0XA837 and 0XEC15 and a permutation of at least one of check bits and data bits.

Figure 4:
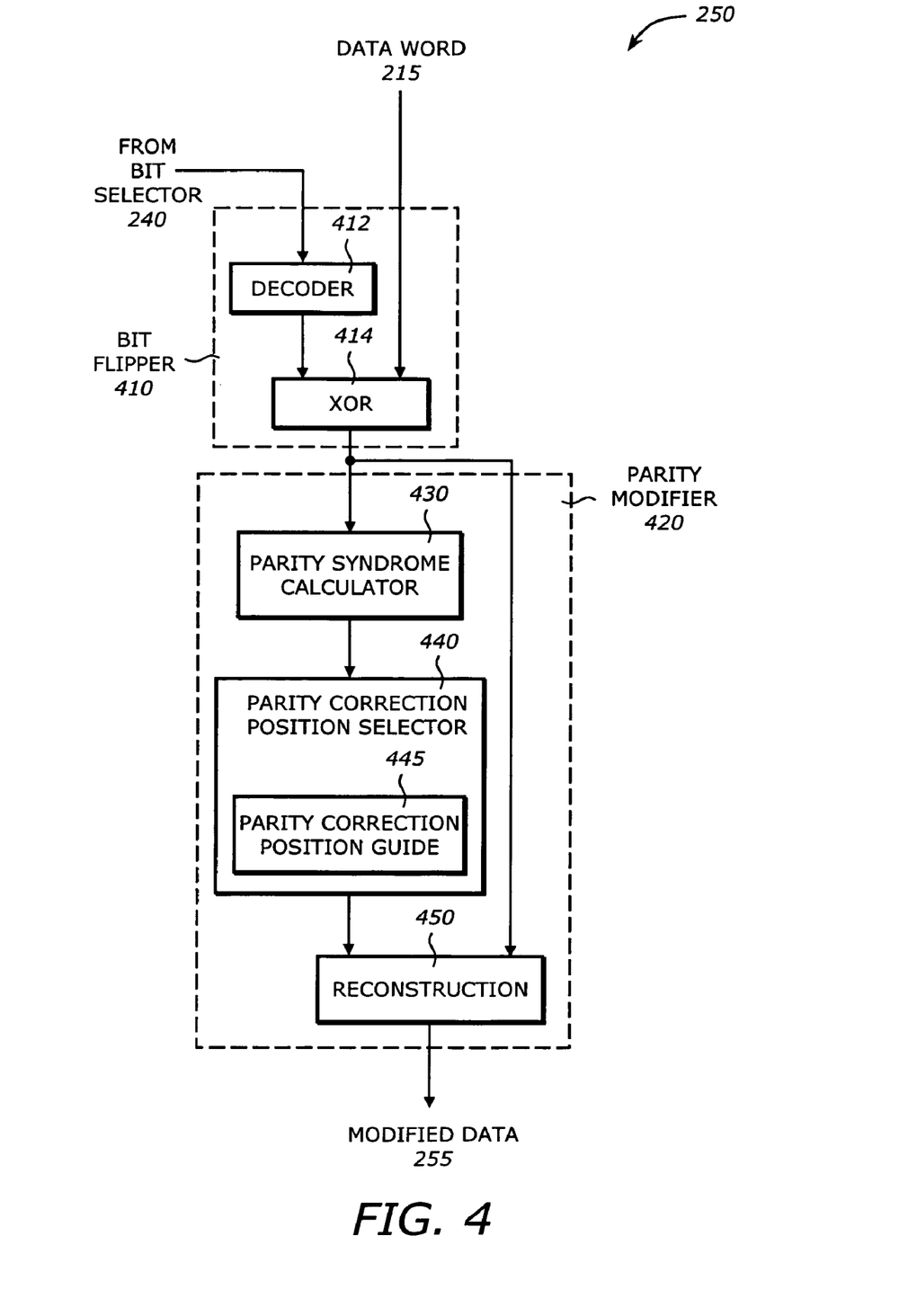
FIG. 4 is a diagram illustrating a data modifier according to one embodiment of the invention.

FIG. 4 is a diagram illustrating the data modifier 250 according to one embodiment of the invention. The data modifier 250 includes a bit flipper 410 and parity modifier 420. The parity modifier 420 is used when parity bits are used in the data word 215.

The bit flipper 410 complements or flips the bit or bits as provided by the bit selector 240 (FIG. 2) according to the bit positions as provided by the bit selector 240. In other words, it changes a zero to a one and a one to a zero. The bit flipper 410 includes a decoder 412 and an Exclusive-OR (XOR) logic 414. The decoder 412 decodes the bit position information. The XOR logic 414 performs exclusive OR operation on the data word 215 and the output of the decoder 412 on a bit-by-bit basis. The bit flipper 410 may also be configured to pass the data word 215 unmodified or bit-flipped depending on the particular phase in the iteration as controlled by the controller 220. The bit flipper 410 may also flip the data word at the selected bit position(s) using a mask. The mask specifies which bit(s) of a number of consecutive bits to flip. The mask may be one-bit long in the simplest case. Several groups of bits at several bit positions may be flipped at the same time or at different times.

The parity modifier 420 is used when the data word 215 include parity words and CRC word as shown in FIG. 3. It includes a parity syndrome calculator 430, a parity correction position selector 440 and a reconstructor 450. The parity syndrome calculator 430 calculates a parity syndrome over the flipped data word which includes the stored parity. The parity correction position selector 440 selects a parity correction position in the data word. The parity correction position selector 440 may iterate over all positions under control of the controller 220. The parity correction position selector 440 includes a parity correction position guide 445 to guide selection of the parity correction position. In this arrangement, the parity correction position selector 440 acts as a mask to select the bit position(s) in the data word to be reconstructed using the parity syndrome. The reconstructor 450 reconstructs the data word. The reconstructor 450 may be implemented by an Exclusive-OR operation, where the parity syndrome is XORed with the data word at the selected parity correction position. The reconstructed data word forms the modified data 255 which is fed to the data syndrome calculator 260 (FIG. 2).

In a typical scenario, a primary error is assumed using the error type selector. This primary error may be modified by the parity syndrome provided by the parity syndrome calculator 430. This parity syndrome may be used as a correction mask. Iterations are then performed in a trial-and-error manner to determine the position of the mask. At some later time a secondary error is detected on a data word of which the parity syndrome is already used for a correction. Iterations on bit positions outside the correction mask position are then performed.

Figure 5:
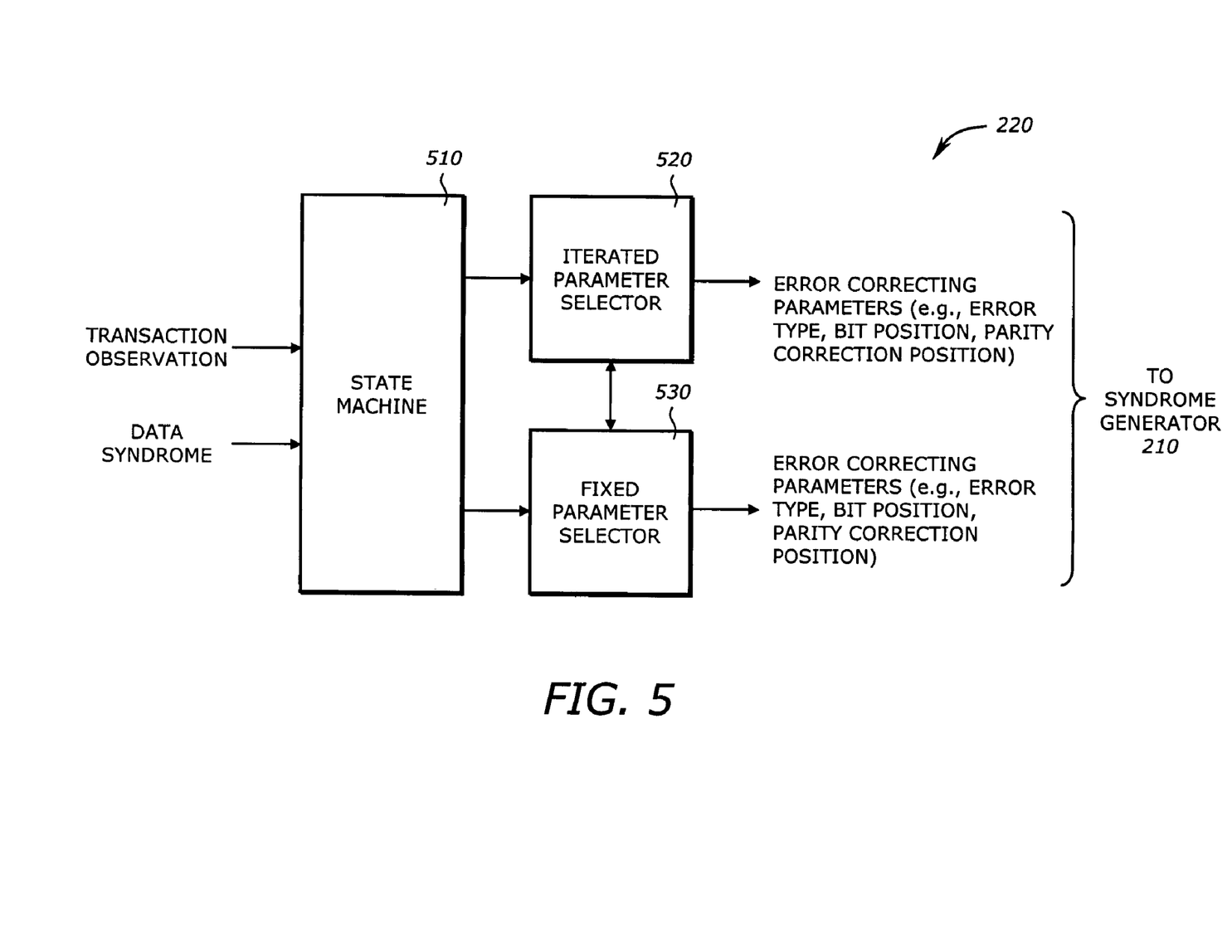
FIG. 5 is a diagram illustrating a controller according to one embodiment of the invention.

FIG. 5 is a diagram illustrating the controller 220 according to one embodiment of the invention. The controller 220 includes a state machine 510, an iterated parameter selector 520 and a fixed parameter selector 530. The trial-and-error technique essentially includes iterations of the selection of the corresponding parameter.

The state machine 510 provides control signals to the iterated parameter selector 520 and the fixed parameter selector 530 to control iterating the syndrome generator 210. It receives information on the data syndrome provided by the data syndrome calculator 260 (FIG. 2) and the transaction observation.

The iterated parameter selector 520 provides iteration on selection of the error correcting parameter(s) such as a first error type, the bit position(s), and the parity unit position. The fixed parameter selector 530 fixes or keeps constant the selection of the error correcting parameter(s) such as a second error type, the bit position(s), and the parity unit position.

The state machine 510 iterates the syndrome generator 210 by iterating selection of a first combination of the error correcting parameters, while fixing a second combination of the error correcting parameters. The first combination is provided by the iterated parameter selector 520 and the second combination is provided by the fixed parameter selector 530. The first combination and the second combination are mutually exclusive or different. For example, the state machine 510 provides control signals to iterate on the bit positions, and the parity unit position while keeping the error type the same. In this example, the first combination includes the bit positions, and the parity unit position, and the second combination includes only the error type (e.g., single-bit error type, but at different bit positions). It is noted that the error type, the bit position, and the parity unit position are just examples of parameters used for the correction. Any relevant parameters that have impact on the error correctability may be used.

With the state machine 510 and the iterated parameter selector 520 and fixed parameter selector 530, the controller 220 may perform a large number of operations in a trial-and-error manner. For example, the controller 220 stops iterating the generation of the data syndrome when the data syndrome is equal to zero. This is when the data word is assumed to be corrected. In another example, the controller 220 continues iterating the syndrome generator for a subset of the error type. This is when the controller 220 has some knowledge that only a subset of the error type is likely and therefore only focuses on this subset to have faster convergence to the solution. In another example, the controller 220 continues iterating the syndrome generator 210 for the same error type, in the meantime observing whether a retry of the original transaction indicates a transient error. In yet another example, the controller 220 keeps on iterating over all scenarios, even after finding a syndrome which is zero, to determine that there is only one corrected data with zero syndrome. Different 'corrected' data each with a zero syndromes indicates that there is at least a miscorrection among them. In yet another example, the controller 220 performs the trial-and-error method for every transaction and goes over a fixed subset of preselected iterations to get a deterministic latency for every transaction in the presence or absence of an error.

Many optimizations may be achieved by further narrowing down the search region of the trial-and-error technique or limit the iterations. For example, the data syndrome calculator 260 may use a look-up table to obtain common error types. The parity modifier 420 may reconstruct the data word in parallel or before, instead of after, the isolated bit corrections, in that case a bit will have to be flipped in the parity syndrome too. The parity mask may be kept the same on the assumption that there was a hard device failure or a hard wire failure.

Figure 6:
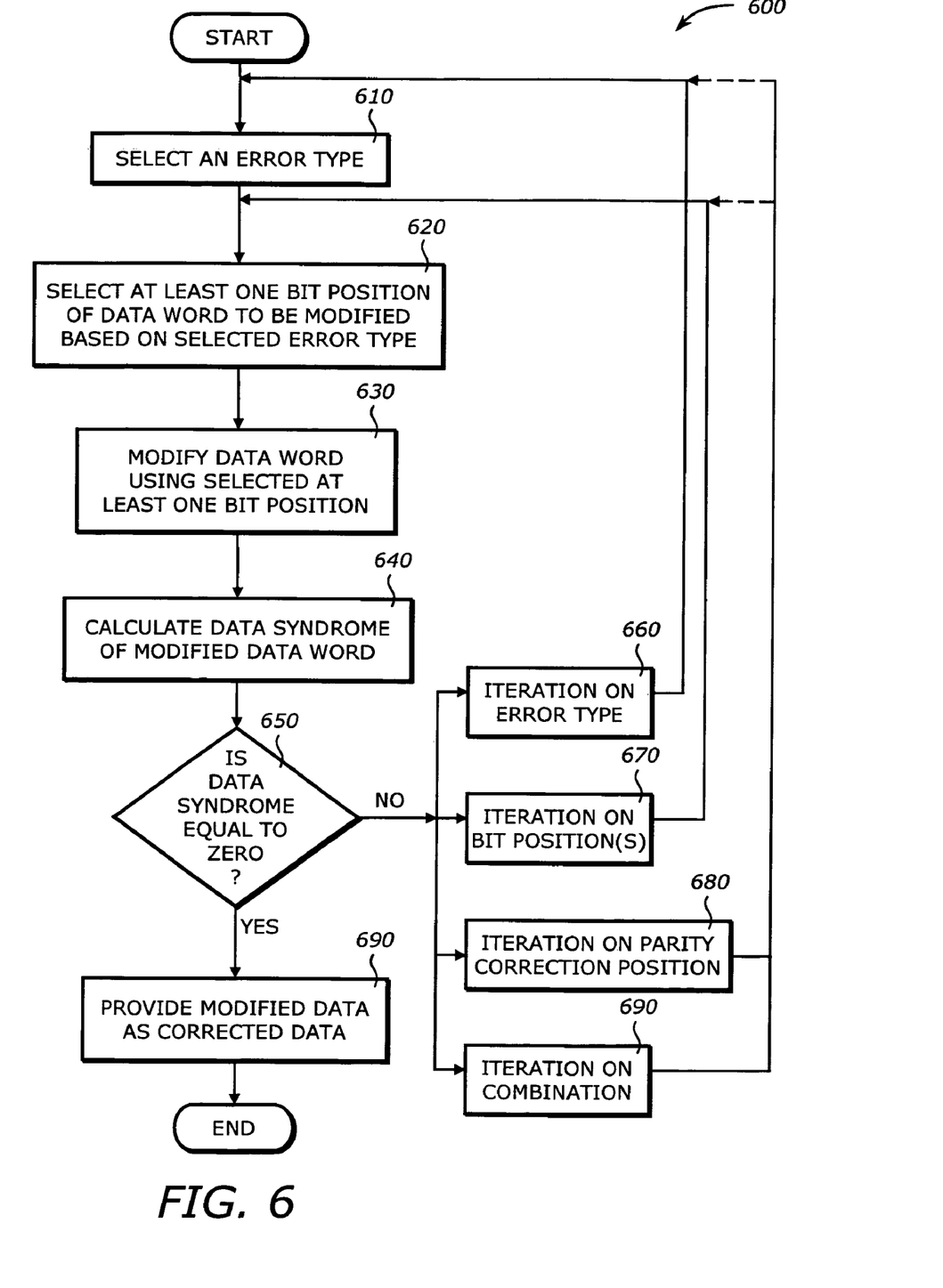
FIG. 6 is a flowchart illustrating a process to correct errors according to one embodiment of the invention.

FIG. 6 is a flowchart illustrating a process 600 to correct errors according to one embodiment of the invention.

Upon START, the process 600 selects an error type (Block 610). The error type may be any one of a single-strike single-bit error type, a single-strike multi-bit error type, a double-strike single+single-bit error type, a double-strike single+multi-bit error type, a double-strike multi+multi-bit error type, a chip or device error type, and a connection failure type. As is known by one skilled in the art, any other error types or any combination of these errors may be included. Then, the process 600 selects at least one bit position of the data word to be modified based on the selected error type (Block 620). Next, the process 600 modifies the data word using the at least one bit position (Block 630). Then the process 600 calculates the data syndrome of the modified data word (Block 640).

Next, the process 600 determines if the data syndrome is equal to zero. If not, the process 600 performs iteration on the error type (Block 660), the bit positions (Block 670), the parity correction position (Block 680), or a combination of these selections (Block 690). Performing iteration here means to select each of the choices. If the process 600 iterates on the error type, it then goes back to Block 610. If the process 600 iterates on the bit positions, it then goes back to Block 620. If the process 600 iterates on the parity correction position or a combination, it then goes back to either Block 610 or 620, depending on the combination. For example, the process 600 may iterate on a subset of the error type, then a subset on the bit positions, then the next subset of the error type, then the same subset or the next subset of the bit positions, etc.

If the data syndrome is equal to zero, the process 600 provides the modified data as the corrected data (Block 690) and is then terminated.

Figure 7:
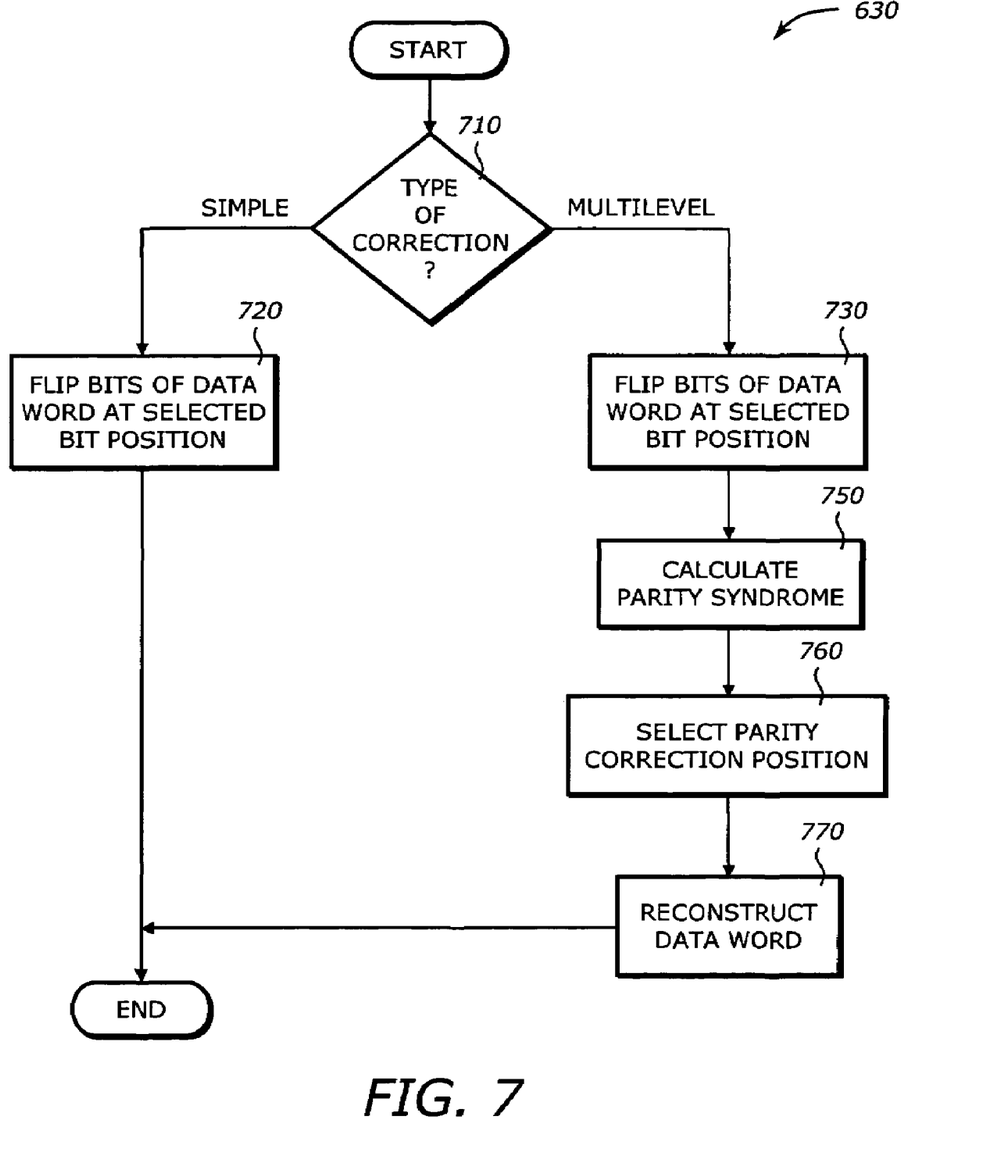
FIG. 7 is a flowchart illustrating a process to modify the data word according to one embodiment of the invention.

FIG. 7 is a flowchart illustrating the process 630 to modify the data word according to one embodiment of the invention.

Upon START, the process 630 determines the type of correction (Block 710). If it is a simple type, the process flips the bit or bits in the data word, such as with the help of a mask, at the selected bit position(s) (Block 720) and is then terminated. If it is a multi-level type such as the one with the parity and the CRC, the process 630 then flips the bit or bits in the data word at the selected bit position(s) (Block 730). Then, the process 630 calculates the parity syndrome (Block 750). Next, the process 630 selects the parity correction position which provides the position of the parity correction in the data word (Block 760) and proceeds to Block 770. Note that the selection of the parity correction position may be iterated as shown in block 680 of FIG. 6.

In Block 770, the process 630 reconstructs the data word based on the parity correction position. The reconstructed data word forms the modified data word. The process 630 is then terminated.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. An apparatus comprising:
a syndrome generator to provide a generation of a data syndrome of a data word modified when at least one of acceptable error correcting parameters is selected, the data word being associated with at least one transaction performed on a device, the error correcting parameters having impact on correctability of errors; and
a controller coupled to the syndrome generator to control iterating the generation of the data syndrome, the controller iterating the syndrome generator by iterating selection of a first combination of the error correcting parameters, while fixing a second combination of the error correcting parameters, the second combination being different from the first combination.

2. The apparatus of claim 1 wherein the error correcting parameters include an error type, a bit position, and a parity correction position.

3. The apparatus of claim 1 wherein the syndrome generator comprises:
an error type selector to select an error type of the data word;
a bit position selector to select at least one bit position of the data word to be modified based on the selected error type;
a data modifier coupled to the bit position selector to modify the data word using the selected at least one bit position; and
a data syndrome calculator coupled to the data modifier to calculate the data syndrome of the modified data word.

4. The apparatus of claim 3 wherein the bit position selector comprises:
   a bit selection guide to guide selection of the at least one bit position.

5. The apparatus of claim 3 wherein the error type is at least one of a single-strike single-bit error type, a single-strike multi-bit error type, a double-strike single+single-bit, a double-strike single+multi-bit error type, a double-strike multi+multi-bit error type, a chip error type, and a connection failure type.

6. The apparatus of claim 5 wherein the controller continues iterating the syndrome generator for a subset of the error type.

7. The apparatus of claim 3 wherein the data modifier comprises:
   a bit flipper to flip the data word at the at least one bit position.

8. The apparatus of claim 7 wherein the data modifier further comprises:
   a parity correction position selector to select a parity correction position in the data word;
   a parity syndrome calculator coupled to the bit flipper to calculate a parity syndrome over the flipped data word; and
   a reconstructor coupled to the parity correction position selector and the parity syndrome calculator to reconstruct the data word at the selected parity correction position, the reconstructed data word forming the modified data word.

9. The apparatus of claim 8 wherein the parity correction position selector comprises:
   a parity correction guide to guide selection of the parity correction position.

10. The apparatus of claim 3 wherein the data syndrome calculator comprises:
    a data syndrome guide to guide selection of the data syndrome based on a look-up table of common error types.

11. The apparatus of claim 1 wherein the error type selector comprises:
    an error selection guide to guide selection of the error type.

12. The apparatus of claim 11 wherein the error selection guide guides the selection using a hint based on one of a syndrome of a group of check bits and an observation of transactions to the device.

13. The apparatus of claim 1 wherein the controller stops iterating the generation of the data syndrome when the data syndrome is equal to zero.

14. The apparatus of claim 1 wherein the controller continues iterating the syndrome generator while retrying the transaction to detect a transient error.

15. The apparatus of claim 1 wherein the controller iterates the syndrome generator by iterating selection of at least one of the error type, the at least one bit position, and the parity correction position.

16. The apparatus of claim 1 wherein the data word includes at least a parity word and a cyclic redundancy check (CRC) word having CRC coefficients.

17. The apparatus of claim 16 wherein the CRC coefficients of polynomial over GF(2) are one of 0X5BF3 and 0X67ED constants generating 14 check bits, and 0XA837 and 0XEC15 constants generating 15 check bits where 0X denotes hexadecimal notation.

18. The apparatus of claim 16 wherein the CRC coefficients of polynomial over GF(2) are formed by at least of one of 0x5bf3, 0x67ed, 0xa837 and 0xec15 constants, where 0x denotes hexadecimal notation, and a polynomial.

19. The apparatus of claim 16 wherein the CRC coefficients of polynomial over GF(2) are formed by at least one of one of 0x5bf3, 0x67ed, 0xa837 and 0xec15 contansts, where 0x denotes hexadecimal notation, and a permutation of at least one of check bits and data bits.

20. The apparatus of claim 1 wherein the controller iterates the syndrome generator for a transaction while going over a fixed subset of preselected iterations to obtain a deterministic latency of the transaction.

21. A method comprising:
    providing a generation of a data syndrome of a data word modified when at least one of acceptable error correcting parameters is selected, the data word being associated with at least one transaction performed on a device, the error correcting parameters having impact on correctability of errors; and
    controlling iterating the generation of the data syndrome, wherein controlling is performed via a controller, the controller iterating the syndrome generator by iterating selection of a first combination of the error correcting parameters, while fixing a second combination of the error correcting parameters, the second combination being different from the first combination.

22. The method of claim 21 wherein the error correcting parameters include an error type, a bit position, and a parity correction position.

23. The method of claim 21 wherein providing the generation of the data syndrome comprises:
    selecting an error type of the data word;
    selecting at least one bit position of the data word to be modified based on the selected error type;
    modifying the data word using the selected at least one bit position; and
    calculating the data syndrome of the modified data word.

24. The method of claim 23 wherein selecting the error type comprises:
    guiding selection of the error type.

25. The method of claim 24 wherein guiding selection of the error type comprises guiding the selection using a hint based on one of a syndrome of a group of check bits and an observation of transactions to the device.

26. The method of claim 23 wherein selecting at least one bit position comprises:
    guiding selection of the at least one bit position.

27. The method of claim 23 wherein the error type is at least one of a single-strike single-bit error type, a single-strike multi-bit error type, a double-strike single+single-bit error type, a double-strike single+multi-bit error type, a double-strike multi+multi-bit error type, a chip error type, and a connection failure type combinations of the previous error types.

28. The method of claim 23 wherein modifying the data word further comprises:
    selecting a parity correction position in the data word;
    calculating a parity syndrome over the flipped data word; and
    reconstructing the data word at the selected parity correction position using the parity syndrome, the reconstructed data word forming the modified data.

29. The method of claim 28 wherein selecting the parity correction position comprises:
    guiding selection of the parity correction position.

30. The method of claim 23 wherein calculating the data syndrome comprises:
    guiding selection of the data syndrome based on a look-up table of common error types.

31. The method of claim 21 wherein controlling iterating comprises stopping iterating the generation of the data syndrome when the data syndrome is equal to zero.

32. The method of claim 21 wherein controlling iterating comprises continuing iterating the syndrome generator for a subset of the error type.

33. The method of claim 21 wherein controlling iterating comprises continuing iterating the syndrome generator while retrying the transaction to detect a transient error.

34. The method of claim 21 wherein modifying the data word comprises:
flipping the data word at the at least one bit position.

35. The method of claim 21 wherein controlling iterating comprises iterating the syndrome generator by iterating selection of at least one of the error type, the at least bit position, and the parity correction position.

36. The method of claim 21 wherein controlling iterating comprises iterating the syndrome generator by iterating selection of a first combination of the error correcting parameters, while fixing a second combination of the error correction parameters, the second combination being different from the first combination.

37. The method of claim 21 wherein the data word includes at least a parity word and a cyclic redundancy check (CRC) word having CRC coefficients.

38. The method of claim 37 wherein the CRC coefficients of polynomial over GF(2) are one of 0X5BF3 and 0X67ED constants generating 14 check bits, and 0XA837 and 0XEC15 constants generating 15 check bits where 0X denotes hexadecimal notation.

39. The method of claim 37 wherein the CRC coefficients of polynomial over GF(2) are formed by at least a product of one of 0X5BF3, 0X67ED, 0XA837 and 0XEC15 constants, where 0X denotes hexadecimal notation, and a polynomial.

40. The method of claim 37 wherein the CRC coefficients over GF(2) are formed by at least one of one of 0X5BF3, 0X67ED, 0XA837 and 0XEC15 constants, where 0X denotes hexadecimal notation, and a permutation of at least one of check bits and data bits.

41. The method of claim 21 further comprising:
iterating the operation of the data syndrome for a transaction while going over a fixed subset of preselected iterations to obtain a deterministic latency of the transaction.

42. A system comprising:
a receiver/transmitter to receive or transmit a data word in at least one transaction; and
an error correcting unit (ECU) coupled to the receiver/transmitter to correct an error on the data word, the ECU comprising:
a syndrome generator to provide a generation of a data syndrome of a data word modified when at least one of acceptable error correcting parameters is selected, the data word being associated with the at least one transaction, the error correcting parameters having impact on correctability of errors, and
a controller coupled to the syndrome generator to control iterating the generation of the data syndrome, the controller iterating the syndrome generator by iterating selection of a first combination of the error correcting parameters, while fixing a second combination of the error correcting parameters, the second combination being different from the first combination.

43. The system of claim 42 wherein the error correcting parameters include an error type, a bit position, and a parity correction position.

44. The system of claim 42 wherein the syndrome generator comprises:
an error type selector to select an error type of the data word;
a bit position selector to select at least one bit position of the data word to be modified based on the selected error type;
a data modifier coupled to the bit position selector to modify the data word using the selected at least one bit position; and
a data syndrome calculator coupled to the data modifier to calculate the data syndrome of the modified data word.

45. The system of claim 44 wherein the error type is at least one of a single-strike single-bit error type, a single-strike multi-bit error type, a double-strike single+single-bit error type, a double-strike single+multi-bit error type, a double-strike multi+multi-bit error type, a chip error type, and a connection failure type.

46. The system of claim 44 wherein the controller continues iterating the syndrome generator for a subset of the error type.

47. The system of claim 44 wherein the controller continues iterating the syndrome generator while retrying the transaction to detect a transient error.

48. The system of claim 44 wherein the data modifier comprises:
a bit flipper to flip the data word at the at least one bit position.

49. The system of claim 48 wherein the data modifier further comprises:
a parity correction position selector to select a parity correction position in the data word;
a parity syndrome calculator coupled to the bit flipper to calculate a parity syndrome over the flipped data word; and
a reconstructor coupled to the parity correction position selector and the parity syndrome calculator to reconstruct the data word at the selected parity correction position, the reconstructed data word forming the modified data.

50. The system of claim 49 wherein the controller iterates the syndrome generator by iterating selection of at least one of the error type, the at least bit position, and the parity unit position.

51. The system of claim 42 wherein the controller stops iterating the generation of the data syndrome when the data syndrome is equal to zero.

52. The system of claim 42 wherein the data word includes at least a parity word and a cyclic redundancy check (CRC) word having CRC coefficients.

53. The system of claim 42 wherein the controller iterates the syndrome generator for a transaction while going over a fixed subset of preselected iterations to obtain a deterministic latency of the transaction.

54. The system of claim 42 wherein the receiver/transmitter is one of a memory unit, a processing unit, a cache memory, a multi-core processor, and a microprocessor.

* * * * *

UNITED STATES PATENT AND TRADEMARK OFFICE
CERTIFICATE OF CORRECTION

| | | |
|---|---|---|
| PATENT NO. | : 7,607,071 B2 | Page 1 of 1 |
| APPLICATION NO. | : 11/046491 | |
| DATED | : October 20, 2009 | |
| INVENTOR(S) | : Neefs et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1144 days.

Signed and Sealed this

Fourteenth Day of December, 2010

David J. Kappos
*Director of the United States Patent and Trademark Office*